(12) United States Patent
Brask et al.

(10) Patent No.: US 7,056,780 B2
(45) Date of Patent: Jun. 6, 2006

(54) ETCHING METAL SILICIDES AND GERMANIDES

(75) Inventors: Justin K. Brask, Portland, OR (US); Robert B. Turkot, Jr., Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 10/622,955

(22) Filed: Jul. 18, 2003

(65) Prior Publication Data

US 2005/0012160 A1   Jan. 20, 2005

(51) Int. Cl.
*H01L 21/336* (2006.01)

(52) U.S. Cl. ................................ 438/197; 438/591

(58) Field of Classification Search ................ 438/151, 438/197, 591, 587, 588
See application file for complete search history.

(56) References Cited

U.S. PATENT DOCUMENTS

| 4,285,761 A | * | 8/1981 | Fatula et al. ................ 438/592 |
| 6,696,327 B1 | * | 2/2004 | Brask et al. ................ 438/197 |

* cited by examiner

*Primary Examiner*—Sara Crane
(74) *Attorney, Agent, or Firm*—Trop, Pruner & Hu, P.C.

(57) ABSTRACT

A metal silicide may be selectively etched by converting the metal silicide to a metal silicate. This may be done using oxidation. The metal silicate may then be removed, for example, by wet etching. A non-destructive low pH wet etchant may be utilized, in some embodiments, with high selectivity by dissolution.

21 Claims, 1 Drawing Sheet

ETCHING METAL SILICIDES AND GERMANIDES

BACKGROUND

This invention relates generally to etching metal silicides and germanides in connection with semiconductor processing.

Metal silicides and germanides are conventionally somewhat difficult to etch. A robust chemistry is needed to remove the silicides or germanides. Selectively etching the silicide, while not adversely affecting surrounding components, is a problem.

One example of a situation where it is desired to etch silicide is in connection with metal gate replacement processes. In such processes, a silicon gate or, more particularly, a polysilicon gate may be removed in a selected number of instances and replaced with a metal gate.

Commonly, the polysilicon material is in contact with a metal and forms a silicide. Conventional etching may not selectively remove the silicide from the polysilicon without adversely affecting other components.

One approach to the problem is to form the metal layer over both the locations where the gate is to be removed and the locations where the gate is to remain. A hard mask may be retained over the gates that will ultimately be removed in order to prevent the formation of a silicide. However, patterning of the high dielectric constant gate oxide may be difficult without removing the hard mask. Thus, the use of a hard mask to protect the polysilicon from the silicide formation is an incomplete solution to the problem.

Thus, there is a need for better ways to facilitate the selective etching of silicides and germanides.

DETAILED DESCRIPTION

In general, a metal silicide or germanide may be selectively etched by converting the metal silicide or germanide into a metal silicate or germanate. This may be done by oxidizing the metal-silicon/germanium bond to form the silicate or germanate. The metal-to-silicide bond is relatively weak compared to silicon-to-oxygen or metal-to-oxygen bonds. Hence, oxidation of the metal-to-silicon bond is energetically favored, given the correct oxidation conditions. The correct oxidation conditions may include, in some embodiments, the use of an aqueous solution of hydrogen peroxide, organic peroxides, gaseous oxygen, or ozone, to mention a few examples. Such treatments oxidize neutral metals and bare silicon to their respective oxides. Also, in some embodiments, extreme oxidation conditions may yield products including silicon dioxide and non-discernable metal species. The intermediate silicon species can be isolated and exploited.

Thus, in some embodiments of the present invention, the silicide or germanide is first converted to a silicate or germanate and then the silicate or germanate is selectively etched away. In other embodiments, the removal and the conversion to silicate or germanate may occur simultaneously in a one-step process.

Figure 1:
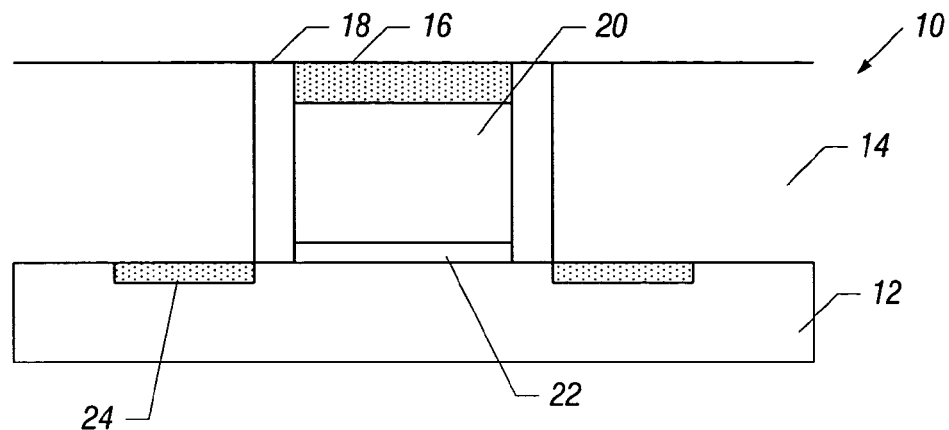
FIG. 1 is an enlarged, cross-sectional view of one embodiment of the present invention at an early stage of manufacture.

Referring to FIG. 1, in an embodiment involving a metal gate replacement process, a semiconductor wafer 10 may include a substrate 12 having a source/drain region 24 formed on either side of the polysilicon gate electrode 20. The substrate 12 may include silicon or germanium. A dielectric 22 may separate the electrode 20 from the substrate 12. Sidewall spacers 18 may coat the side of the gate electrode 20. A germanide or silicide 16 may be formed over the gate electrode 20. For example, cobalt or nickel silicides may be formed. An interlayer dielectric 14 may be positioned over the substrate 12, around the gate electrode 20 and the silicide 16.

Figure 2:
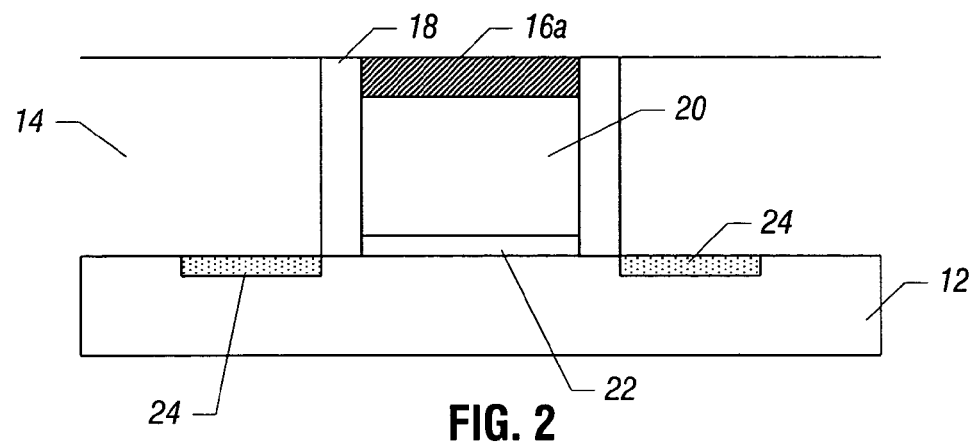
FIG. 2 is an enlarged, cross-sectional view corresponding to FIG. 1 after further processing.
Figure 3:
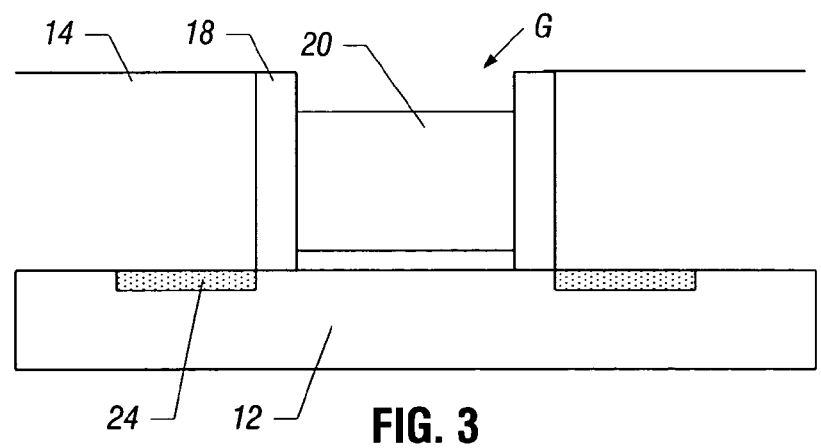
FIG. 3 is an enlarged, cross-sectional view of the embodiment in FIG. 2 after further processing.

The structure shown in FIG. 1 may be exposed to a mild oxidant, such as hydrogen peroxide or $R_2O_2$ (where R is an organic material), $O_3$ in vapor or gas form, or $O_2$ in gaseous form. The oxidation converts the germanide or silicide 16 into the germinate or silicate 16a as indicated in FIG. 2. Next, the germinate or silicate 16a may be selectively etched using a non-destructive, low pH wet etchant, such as $H_3PO_4$, sulfuric acid, chelating species, or supercritical carbon dioxide at lower temperatures such as 25 to 120° C. In one embodiment, the wafers may be immersed in a bath of liquid etchant. These etchants have high selectivity and work by dissolution. This results in the selective removal of the silicate 16a.

In some embodiments, the oxidation and the wet etching processes may be combined, enabling the silicide to be removed in essentially one step with two parallel processes occurring at the same time.

It is desirable, in some embodiments, to use mild oxidation to reduce the formation of silicon dioxide. Selectively removing silicon dioxide is more difficult because of the likelihood that other occurrences of silicon dioxide on the wafer will be unintentionally removed.

In some embodiments, after exposing the gate electrode 20, the gate electrode 20 may be removed using conventional technology and the gate electrode may be replaced with a metal gate electrode. However, the present invention is not necessarily limited to silicide removal in connection with metal gate replacement processes.

In some embodiments, vaporous or gaseous oxidizers may be used. But given the cage-like structure of silicate oligomers, the use of liquid oxidants may be advantageous.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   converting a metal silicide on a polysilicon gate electrode into a metal silicate;
   selectively removing the metal silicate using an etchant that is selective to metal silicate; and
   thereafter removing the polysilicon gate electrode.

2. The method of claim 1 including selectively removing the metal silicate using a wet etchant.

3. The method of claim 2 including selectively removing the metal silicate using a wet etchant at a temperature between 25 and 120° C.

4. The method of claim 1 converting a metal silicide into a metal silicate using oxidation.

5. The method of claim 4 including using a metal oxidant selected from the group including hydrogen peroxide, $R_2O_2$, where R is an organic substituent, $O_3$ or $O_2$.

6. A method comprising:
forming at least two polysilicon gate electrodes;
forming a metal silicide on said gate electrodes;
convening the metal silicide on one of said gate electrodes to a metal silicate and selectively removing the metal silicate; and
removing the exposed polysilicon gate electrode.

7. The method of claim 6 including selectively removing the metal silicate using a wet etchant.

8. The method of claim 7 including selectively removing the metal silicate using a wet etchant at a temperature between 25 and 120° C.

9. The method of claim 6 including converting a metal silicide into a metal silicate using oxidation.

10. The method of claim 9 including using a metal oxidant selected from the group including hydrogen peroxide, $R_2O_2$, where R is an organic substituent, $O_3$ or $O_2$.

11. A method comprising:
converting a metal germanide into a metal germanate; and
selectively removing the metal germinate by using an etchant that is selective of the metal germanate.

12. The method of claim 11 including selectively removing the metal germanate using a wet etchant.

13. The method of claim 12 including selectively removing the metal germanate using a wet etchant at a temperature between 25 and 120° C.

14. The method of claim 11 converting a metal germanide into a metal germanate using oxidation.

15. The method of claim 14 including using a metal oxidant selected from the group including hydrogen peroxide, $R_2O_2$, where R is an organic substituent, $O_3$ or $O_2$.

16. The method of claim 11 including converting a metal germanide on a polysilicon gate electrode into a metal germanate, selectively removing the metal germanate, and thereafter removing the polysilicon gate electrode.

17. A method comprising:
forming at least two gate electrodes;
forming a metal germanide on said gate electrodes;
converting the metal germanide on one of said gate electrodes to a metal germanate and selectively removing the metal germinate using an etchant that selectively etches metal germanate; and
removing the exposed gate electrode.

18. The method of claim 17 including selectively removing the metal germanate using a wet etchant.

19. The method of claim 18 including selectively removing the metal germanate using a wet etchant at a temperature between 25 and 120° C.

20. The method of claim 17 including converting a metal germanide into a metal germanate using oxidation.

21. The method of claim 20 including using a metal oxidant selected from the group including hydrogen peroxide, $R_2O_2$, where R is an organic substituent, $O_3$ or $O_2$.

* * * * *